United States Patent [19]

Yamauchi et al.

[11] Patent Number: 4,603,404
[45] Date of Patent: Jul. 29, 1986

[54] SEMICONDUCTOR MEMORY DEVICE WITH REDUNDANT CELLS

[75] Inventors: Takahiko Yamauchi; Teruo Seki, both of Kawasaki; Keizo Aoyama, Yamato, all of Japan

[73] Assignee: Fujitsu Limited, Kawasaki, Japan

[21] Appl. No.: 453,575

[22] Filed: Dec. 27, 1982

[30] Foreign Application Priority Data

Dec. 29, 1981 [JP] Japan .................. 56-213717

[51] Int. Cl.⁴ .............................. G11C 7/00
[52] U.S. Cl. .................................. 365/200
[58] Field of Search ....................... 365/200

[56] References Cited

U.S. PATENT DOCUMENTS

| | | | |
|---|---|---|---|
| 3,753,244 | 8/1973 | Sumilas et al. | 365/200 |
| 3,755,791 | 8/1973 | Arzubi | 365/200 |
| 3,940,740 | 2/1976 | Coontz | 365/200 |
| 4,281,398 | 7/1981 | McKenny et al. | 365/200 |
| 4,389,715 | 6/1983 | Eaton, Jr. et al. | 365/200 |

Primary Examiner—James W. Moffitt
Attorney, Agent, or Firm—Staas & Halsey

[57] ABSTRACT

A semiconductor memory device in which the memory cells are arranged in matrix form and in which, when a defective cell exists among the memory cells and a row or column containing the defective cell is selected, the selected row or column is switched to a predetermined redundant row or a predetermined redundant column additionally and independently provided. A plurality of switching circuits are provided, each of the switching circuits being connected to the output of the decoder circuit, which select the row or the column of memory cells. A fusing circuit is connected to each of the switching circuits, and when the fuse in the fusing circuit is disconnected, the row or the column containing the defective cell is switched to the redundant row or the redundant column.

5 Claims, 10 Drawing Figures

Fig. 1

PRIOR ART

SEMICONDUCTOR MEMORY DEVICE WITH REDUNDANT CELLS

BACKGROUND OF THE INVENTION

The present invention relates to a semiconductor memory device in which a redundant process for memory cells included therein is improved.

In a semiconductor memory device in which a plurality of memory cells are arranged in matrix form, if a defective memory cell exists in a row or a column of memory cells, the semiconductor memory device is provided with a redundant row or a redundant column in place of the row or column containing the defective cell.

For example, U.S. Pat. No. 4,250,570 which is a continuation of U.S. patent application Ser. No. 705,597 filed July 15, 1976 now abandoned, discloses a method for switching a row or a column containing a defective cell to a redundant row or a redundant column. Japanese Patent Kokai No. 51-93641, filed by the assignee of the subject application, Fujitsu Limited, discloses a semiconductor memory device in which a redundant row or column decoder for programming a defective address is provided, and Japanese Patent Kokai No. 52-27326 discloses a semiconductor memory device in which a read-only memory for storing a defective address is provided.

Further, U.S. patent application Ser. No. 258,572 filed June 1, 1972 and now U.S. Pat. No. 3,755,791, discloses a device in which a plurality of switching circuits, for every bit row or every bit column, is provided. However, in the switching circuits, the memory circuit for driving the memory cells requires many transistors and many electric sources, as well as a high-voltage source, so as to latch the information bits therein.

SUMMARY OF THE INVENTION

An object of the present invention is to provide a semiconductor memory device having switching circuits which can be simply constructed with few elements.

Another object of the present invention is to provide a semiconductor memory device having switching circuits which can be activated by a low-voltage source.

The above-mentioned objects can be achieved by providing a semiconductor memory device in which, when a defective cell exists among memory cells arranged in matrix form and a row or column containing the defective cell is selected, the selected row or column is switched to a predetermined redundant row or a predetermined redundant column additionally and independently provided so that the predetermined redundant row or the predetermined redundant, column is selected. The semiconductor memory device includes a plurality of switching circuits, each of which is connected to an output of a decoder circuit which selects the row or column, and a plurality of fusing circuits, each of which is connected to a respective switching circuit so that when the fuse in the fusing circuit is disconnected, the row or column containing the defective cell is switched to the redundant row or column.

Further features and advantages of the present invention will be apparent from the ensuing description, with reference to the accompanying drawings, to which, however, the scope of the invention is in no way limited.

DESCRIPTION OF THE PREFERRED EMBODIMENTS

Figure 1:
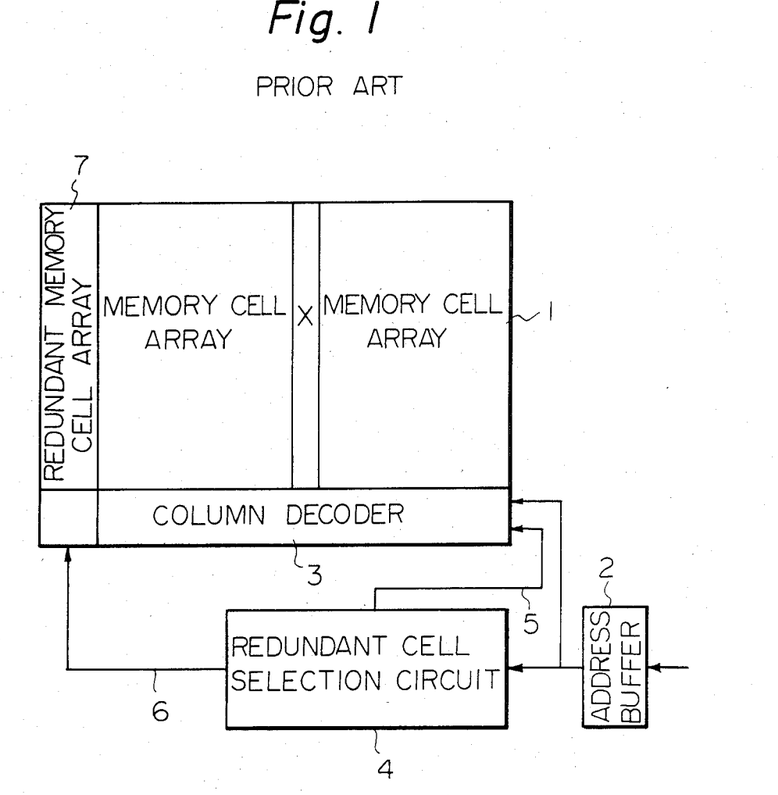
FIG. 1 is a block diagram of a conventional semiconductor memory device which includes a redundant column.

FIG. 1 is a conventional semiconductor memory device having a redundant memory cell array. In the memory device, when a defective cell, indicated by "X", is found in a cell array 1, if the column containing the defective cell is selected by the output of a column decoder 3, which receives the address transmitted by an address buffer 2, a low-level signal is transmitted over a control line 5 of a redundant cell selection circuit 4, by which it is possible to program the address of the column so that the operation of the column decoder 3 is stopped. On the other hand, a high-level signal is transmitted over a control line 6, and a redundant memory cell column 7 is selected so that access to the memory cell column 7 is carried out.

When, in the above-mentioned redundant process, the memory cell array 1 is formed by a large number of bits, there is a drawback in that, as the control line 5 is connected to the column decoder 3, if a one-bit memory cell is defective, the redundant process is necessary for all of the memory cell columns which form the many bits. Therefore, many memory cells are used ineffectively. Further, the redundant cell selection circuit 4 should be made programmable so as to make excess redundancy possible for all of the columns.

Figure 2:
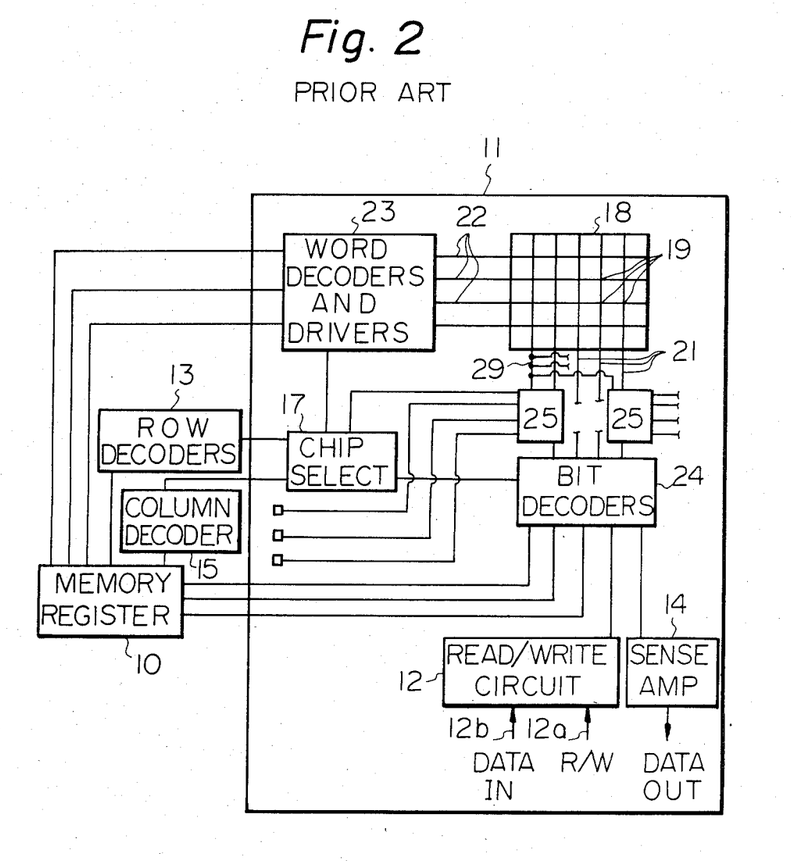
FIG. 2 is one example of a switching circuit used in a conventional semiconductor memory device for switching a defective row to a redundant row.

FIG. 2 shows a conventional semiconductor memory device disclosed in U.S. patent application Ser. No. 258,572 filed June 1, 1972 and now U.S. Pat. No. 3,755,791, and which has a switching circuit for switching a defective line to a redundant line. In FIG. 2, one chip 11 is selected by the row address and column address supplied to a chip select circuit 17 via a row decoder 13 and a column decoder 15. Each chip 11 includes an array 18 containing a plurality of storage cells 19 which belong to a main group of storage cells defined by bit lines 21 and word lines 22. The word lines 22 are coupled to a series of word decoders and drivers 23, and the bit lines 21 are coupled to a series of bit decoders 24. The bit lines 21 are also coupled via a plurality of switching circuits, for example, 25 and 25', to redundant bit lines 29. The cells forming the redundant lines 29 are used in place of the defective line in the main group of cells.

If all of the cells in a particular chip selected by the chip select circuit 17 are non-defective for the bit lines 21, the selected chip is switched to a high-power state and the word decoders and drivers 23 are actuated by signals on address lines coupled to a memory register 10. At the same time, the bit decoder 24 is activated by signals from the memory registers 10.

The signals transmitted by the memory register 10 to the word decoders and drivers 23 are decoded so that only one of the word lines 22 is selected and driven. The signals transmitted by the memory register 10 to the bit decoders 24 are decoded so that only one of the bit lines 21 is selected and driven. Data is stored in the selected cell, which coincides with a read/write pulse input 12a of a read/write circuit 12, together with a data input pulse from a data input 12b. When only a read pulse is supplied to the input 12a, the condition of the selected cell is read and the state of the cell, detected by a sense amplifier 14, is output as output data.

If the chip contains one or more defective cells defined by bit lines 21 and word lines 22, the switching circuit 25 associated with the defective bit is activated to disable the defective bit line 21 and activate the redundant line 29. Data can then be stored in or read out of the redundant line 29.

However, the switching circuit shown in FIG. 2 requires many transistors and many electric circuits, as well as a high-voltage source.

An embodiment of the present invention will be explained with reference to FIG. 3.

Figure 3:
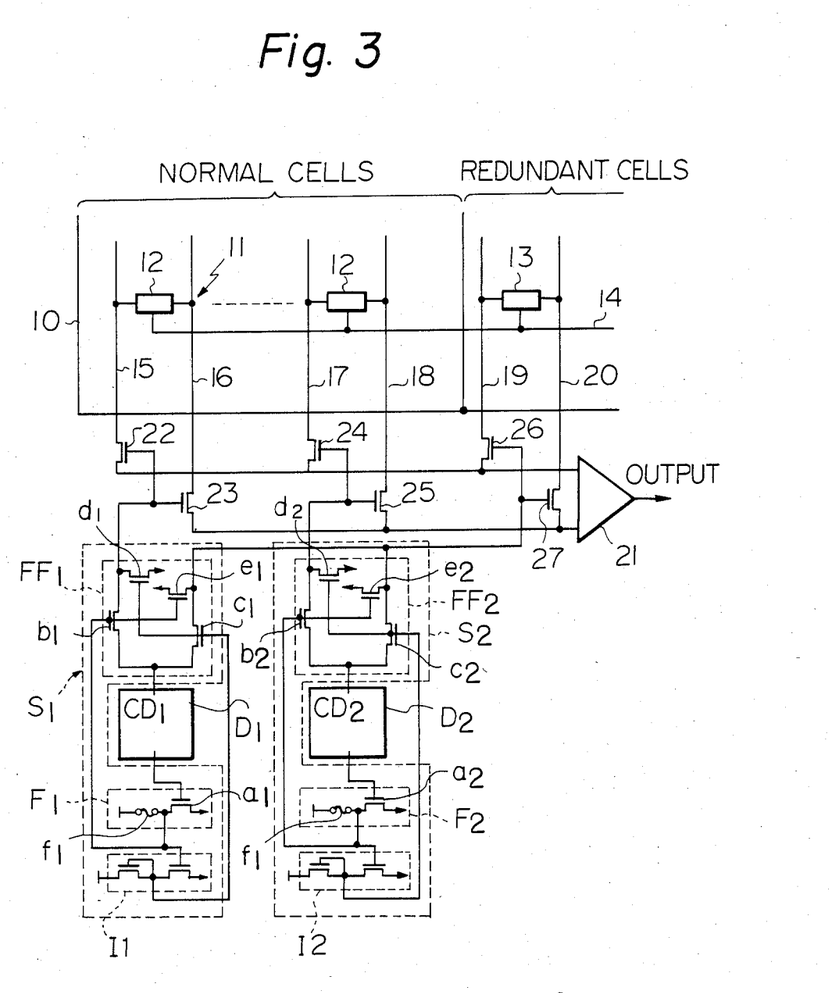
FIG. 3 is an embodiment of the semiconductor memory device according to the present invention.

In FIG. 3, reference numeral 10 designates a memory portion in which a plurality of memory cells 11 are arranged in matrix form. The memory portion 10 includes normal cells 12 and redundant cells 13. These cells form a predetermined number of columns (not clearly shown in FIG. 2). Reference numeral 14 designates a word line, and 15, 16, 17, 18, 19 and 20 designate bit lines. Of the bit lines, 15 and 16 are first column bit lines, 17 and 18 are second column bit lines, and 19 and 20 are bit lines in the redundant cell column. Reference numeral 21 designates a sense amplifier, and 22, 23, 24, 25, 26 and 27 are field-effect transistors provided between the amplifier 21 and the bit lines 15, 16, 17, 18, 19 and 20. Switching circuits $S_1$ and $S_2$ are provided between the gates of transistors 22, 23, 24 and 25 and decoders $D_1$ and $D_2$ in each column.

Since the construction of the switching circuits $S_1$ and $S_2$ is the same for each column decoder, only the switching circuit $S_1$ for the first column decoder $D_1$ is explained in detail here. The suffix "2" is attached to each of the elements forming the switching circuit. The function of the column decoder $D_2$ is the same as that of the column decoder $D_1$ and therefore an explanation of the decoder $D_2$ is omitted.

As is shown in FIG. 3, the switching circuit $S_1$ includes a fusing circuit $F_1$ which is connected to an output $CD_1$ of the column decoder $D_1$, an inverter circuit $I_1$ which is connected to the output of the fusing circuit $F_1$, and a flip-flop circuit $FF_1$ which is connected to the output of the fusing circuit $F_1$ and the output of the inverter circuit $I_1$ and which selectively outputs the output $CD_1$ of the column decoder $D_1$ to one of two outputs of the circuit $FF_1$ by changing the stable state of the outputs of the circuits $F_1$ and $I_1$. The circuits $F_1$, $I_1$ and $FF_1$ are formed from field-effect transistors, as is shown in FIG. 3. In the circuit $F_1$, $f_1$ is a fuse and $a_1$ is a field-effect transistor. In the circuit $FF_1$, $b_1$, $c_1$, $d_1$ and $e_1$ are field-effect transistors.

Next, the function of the above-mentioned device according to the present invention is explained.

If a defective cell is found in a memory column, for example, in the second column of a plurality of memory cells arranged in matrix form, a redundant process is carried out with respect to the second column. That is, an address is supplied to the second column decoder $D_2$, and a high-level output signal is generated at an output terminal $CD_2$ of the column decoder $D_2$ so that a transistor $a_2$ in a fusing circuit $F_2$ is placed in a conductive state via a gate transistor (not shown in the drawing). At the same time, a voltage slightly higher than the normal voltage is supplied to the fusing circuit $F_2$ so as to melt the fuse $f_1$. Therefore, a low-level signal is always generated at the output of the fusing circuit $F_2$.

Accordingly, a high-level signal is always generated at the output of an inverter circuit $I_2$. This high-level signal and the low-level signal generated at the output of the fusing circuit $F_2$ are supplied to a flip-flop circuit $FF_2$. Therefore, transistors $c_2$ and $d_2$ in the flip-flop circuit $FF_2$ are placed in an "on" state and the transistors $b_2$ and $e_2$ are placed in an "off" state.

After switching by the switching circuit $S_2$, a normal address is supplied to the column decoder $D_2$ in the second column by usual access so that the normal address is decoded. As a result, a high-level signal which appears at the output $CD_2$ is supplied, via the on-state transistor $c_2$ in the flip-flop circuit $FF_2$, to transistors 26 and 27 so that the transistors are placed in an "on" state and the bit lines 19 and 20 are connected to the sense amplifier 21. At the same time, the word line 14 is activated and the content of the redundant cell 13 is sensed by the sense amplifier 21 and is output by the sense amplifier 21.

During access, a low-level output signal is transmitted by the flip-flop circuit $FF_2$ to the gates of the transistors 24 and 25 so that the bit lines 17 and 18 in the second column are not connected to the sense amplifier 21.

Figure 4:
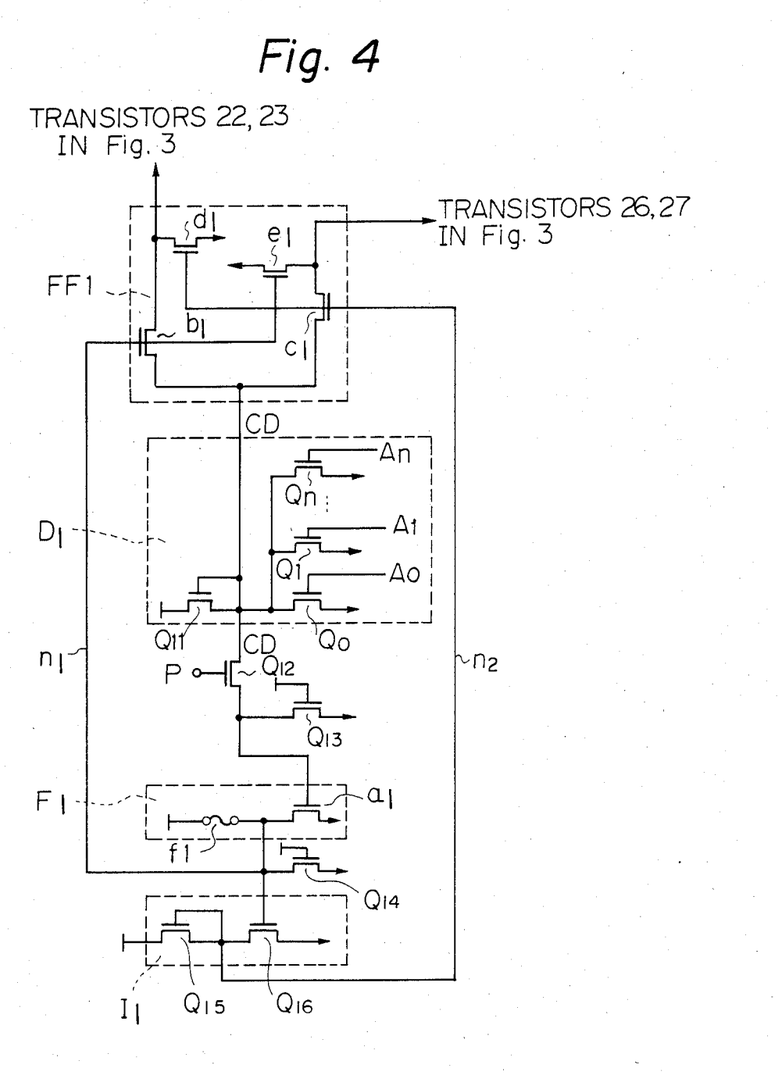
FIG. 4 is an embodiment of the switching circuit and decoder circuit shown in FIG. 3.

FIG. 4 is a diagram of the switching circuits $S_1$ and $S_2$ and the decoder circuits $D_1$ and $D_2$ shown in FIG. 3. In FIG. 4, the same elements as those in FIG. 3 are illustrated by the same symbols as those in FIG. 3. The construction of the switching circuit $S_2$ and the decoder circuit $D_2$ is the same as that of the switching circuit $S_1$ and the decoder circuit $D_1$, respectively, and, therefore, is not shown.

The decoder circuit $D_1$ is formed from a load transistor $Q_{11}$ (a depletion-type metal-oxide semiconductor transistor) and a NAND circuit including transistors $Q_0, Q_1, \ldots, Q_n$. When address signals $A_0 \sim A_n$ are all in a low-level state, the transistors $Q_0 \sim Q_n$ are placed in an off state so that an output CD is placed in a high-level state, that is, a selective state. When at least one of the address signals $A_0 \sim A_n$ is in a high-level state, at least one the transistors $Q_0 \sim Q_n$ is placed in an on state so that the output CD is placed in a low-level state, that is, a nonselective state.

When a row or column containing a defective cell is found, the address signal of the row or column is transmitted to the decoder circuit so that the output of the decoder is placed in an on state, and a redundant signal P is transmitted to a gate of a transistor $Q_{12}$. Therefore, the transistor $a_1$ in the fusing circuit $F_1$ is placed in an on state and the fuse $f_1$ is disconnected. An output $n_1$ of the fusing circuit $F_1$ is transmitted together with an inverted output $n_2$ of the inverter $I_1$ to the flip-flop $FF_1$ so that the state of the flip-flop circuit $FF_1$ is inverted.

When the address is selected by the usual successive operation, the circuit is activated, as stated with reference to FIG. 3.

In FIG. 4, transistors $Q_{13}$ and $Q_{14}$ must be small mutual conductance ($g_m$) transistors because when the output CD of the decoder circuit $D_1$ is transmitted via the gate of the transistor $Q_{12}$ to the transistor $a_1$ of the fusing circuit $F_1$, the current which flows through the transistor $Q_{13}$ so as to turn on the transistor $a_1$ must have a small value.

In such a manner, the redundant process is carried out in the redundant column for the second column containing a defective cell, with the result that even if the memory device contains a defective cell, the memory device can completely carry out the desired function.

Further, if the circuit, which effects the above-mentioned-operation, has an output which is formed from many bits, redundant process is effected for each column containing a defective cell. Therefore, if a word is formed from many bits and a defective cell is contained in the memory cells, in the redundant process of the present invention, the means by which all memory cell columns formed from many bits conventionally switched to a redundant cell column, is not necessary. That is, a normal memory cell column which actually should be processed by means of the redundant process can be switched to a redundant memory cell column, so that excess redundancy is not necessary and the memory cells can be effectively utilized.

The above-mentioned embodiment has been explained with reference to a case in which the switching circuits $S_1$ and $S_2$ are switched by the operation of the fusing circuit. However, it should be understood that the above switching operation can also be carried out by a signal generated, when a defective cell is contained in a column, in response to a non-inverted or an inverted output of the column decoder.

According to the present invention, it is not necessary to carry out excess redundancy, and, therefore, the memory cells can be effectively utilized.

When the fuse $f_1$ is completely blown, the transistor $a_1$ for blowing the fuse $f_1$ should be placed completely in the on state. Next, the technique by which the transistor for blowing the fuse $f_1$ is placed completely in the on state will be explained.

Figure 5:
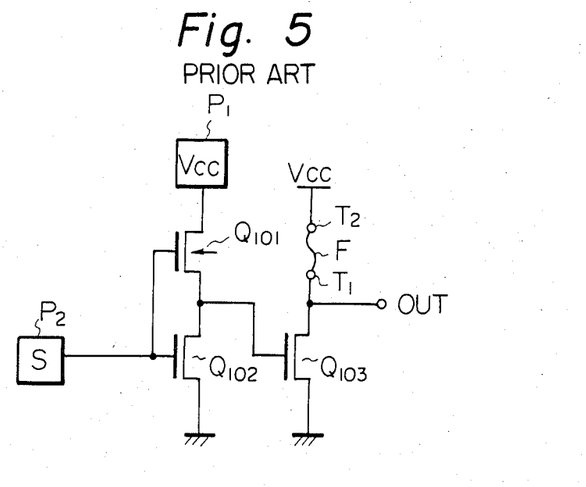
FIG. 5 is an example of a conventional fusing circuit.

FIG. 5 is an example of a conventional fusing circuit which is frequently used. In the figure, a P-channel metal-oxide semiconductor (MOS) transistor $Q_{101}$ and a Q-channel MOS transistor $Q_{102}$ are connected in series so as to form a complementary metal-oxide semiconductor (CMOS) inverter. The drain of the transistor $Q_{101}$ is connected to an external terminal $P_1$ and the source thereof is connected to the drain of the transistor $Q_{102}$. The gates of the transistor $Q_{101}$ and $Q_{102}$ are commonly connected to an input terminal $P_2$, and the source of the transistor $Q_{102}$ is connected to ground $V_{ss}$. The connection point of the source of the transistor $Q_{101}$ and the drain of the transistor $Q_{102}$ is connected to the gate of a transistor $Q_{103}$ for blowing a fuse. The drain of the transistor $Q_{103}$ is connected to a terminal $T_1$ of a fuse $F_1$ and another terminal $T_2$ is connected to a source. The source of the transistor $Q_{103}$ is connected to ground $V_{ss}$. The transistor $Q_{103}$ corresponds to the transistor $a_1$ in FIG. 4.

Figure 6:
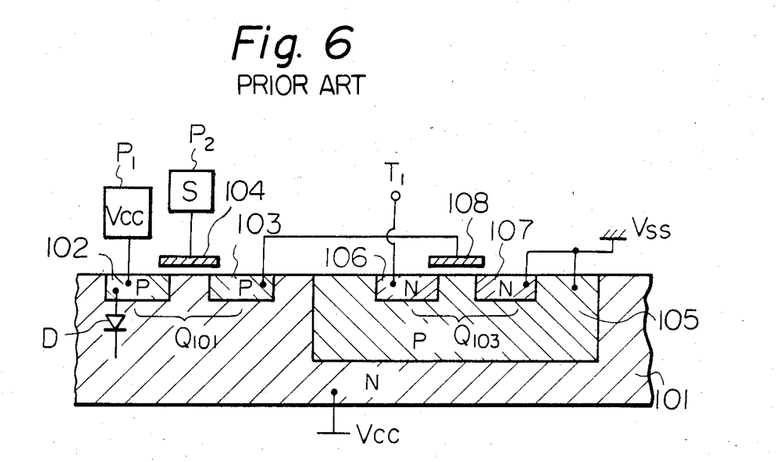
FIG. 6 is a sectional view of the fusing circuit of FIG. 5.

FIG. 6 is a sectional view of a device in which the transistor $Q_{103}$ of the fusing circuit shown in FIG. 5 has a P-type well. In FIG. 6, the transistors $Q_{101}$ and $Q_{103}$ are formed on a semiconductor substrate 101. The transistor $Q_{102}$ is not shown in FIG. 6 because it is formed behind the transistors $Q_{101}$ and $Q_{103}$. The transistor $Q_{101}$ is provided with a P-type drain diffusion region 102, a P-type source diffusion region 103, and a gate electrode 104. The P-type drain diffusion region 102 is connected to the external terminal $P_1$, and the gate electrode 104 is connected to the input terminal $P_2$. When the fuse is blown, the external terminal $P_1$ is supplied by an electric voltage $V_{cc}$ and the input terminal $P_2$ is supplied by ground voltage $V_{ss}$. The transistor $Q_{103}$ is provided with a gate electrode 108, an N-type drain diffusion region 106 and an N-type source diffusion region 107 which are formed in a P-type well 105. The N-type drain diffusion region 106 is connected to a terminal $T_1$ of the fuse, the gate electrode 108 is connected to the P-type source diffusion region 103 of the transistor $Q_{101}$, and the N-type source diffusion region 107 and the P-type well 105 are grounded. In a P-type well, a source voltage $V_{cc}$ is supplied to the N-type semiconductor substrate so as to prevent the current from flowing into a diode D formed by a PN junction between the P-type drain diffusion region 102 and the N-type source diffusion region 107.

In FIG. 5 and FIG. 6, when the fuse F is blown, a source voltage $V_{cc}$ (for example, 5 volts), which is the same voltage as the substrate voltage, is supplied to the drain of the transistor $Q_{101}$, a ground voltage $V_{ss}$ is supplied to the gates of the transistors $Q_{101}$ and $Q_{102}$ so that the transistor $Q_{101}$ is turned on and the transistor $Q_{102}$ is turned off, and a high voltage is supplied to the gate of the transistor $Q_{103}$. When the transistor $Q_{103}$ is turned on by the high voltage supplied to the gate thereof, a large current flows in the fuse F so that the fuse F is blown.

To completely turn on the transistor $Q_{103}$, the gate voltage of the transistor $Q_{103}$ must be sufficiently high. Therefore, the voltage supplied to the terminal $P_1$ must be sufficiently high. However, in the MOS P-type well shown in FIG. 6, a voltage higher than $V_{cc}$ cannot be supplied to the external terminal $P_1$ because if a voltage higher than $V_{cc}$ is supplied to the terminal $P_1$ in order for a large current to flow to the transistor $Q_{102}$, a diode D is formed between the P-type drain diffusion region 102 of the transistor $Q_{101}$ and the semiconductor substrate 101, with the result that the greater part of the current flowing from the external terminal $P_1$ to the P-type drain diffusion region 102 flows via the diode D to the substrate 101 and thereby the transistor $Q_{102}$ cannot be placed in the on state. Further, if the external terminal $P_1$ is connected to a voltage source $V_{cc}$ equal to that of the other memory circuits so as to blow the fuse, the MOS transistors in the other memory circuits may be destroyed. For this reason, the gate voltage of the transistor $Q_{103}$ for blowing the fuse cannot be raised higher than the voltage $V_{cc}$, with the result that a sufficiently large current for blowing the fuse cannot be supplied to the fuse F. Further, as is shown in FIG. 3, when the gate voltage of the transistor $a_1$ is supplied via a plurality of elements, such as $Q_{11}$ and $Q_{12}$, the supplied voltage is insufficient.

Figure 7:
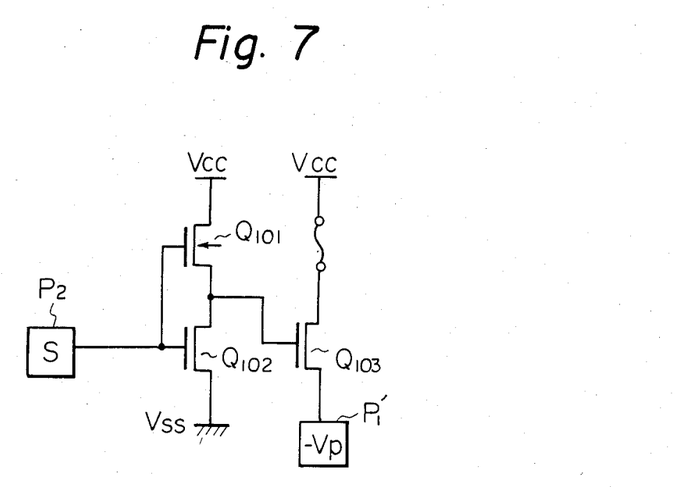
FIG. 7 is a first embodiment of a fusing circuit according to the present invention.
Figure 8:
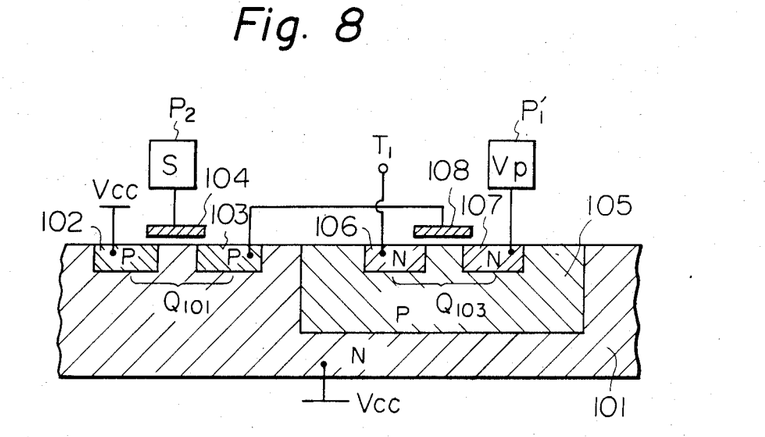
FIG. 8 is a sectional view of the fusing circuit of FIG. 7.

One method for overcoming the above-mentioned drawback is shown in FIGS. 7 and 8.

The difference between FIGS. 7 and 8 and FIGS. 5 and 6 is that in FIGS. 7 and 8 the drain of the P-channel MOS transistor $Q_{101}$ is connected to a source voltage $V_{cc}$ rather than to the external terminal $P_1$ and in that the source of the N-channel transistor $Q_{103}$ for blowing the fuse is connected to an external terminal P'₁, to which a negative voltage, such as −5 volts, is supplied, rather than to ground potential $V_{ss}$. The other devices of FIGS. 7 and 8 are the same as those of FIGS. 5 and 6.

In the embodiment shown in FIGS. 7 and 8, if the level of the voltage supplied to the drain of the transistor $Q_{101}$ is the same as that the voltage $V_{cc}$ in the semiconductor substrate, a negative voltage is supplied via the external terminal P'₁ to the source of the transistor $Q_{103}$ when the fuse is blown and the voltage between the gate and the source of the transistor $Q_{103}$ can be made higher than the threshold voltage of the transistor $Q_{103}$, with the result that the transistor $Q_{103}$ is definitely turned on when the fuse F is blown. Further, no potential difference exists between the drain of the transistor $Q_{101}$ and the semiconductor substrate, with the result that no current flows from the drain of the transistor $Q_{101}$ to the semiconductor substrate.

Figure 9:
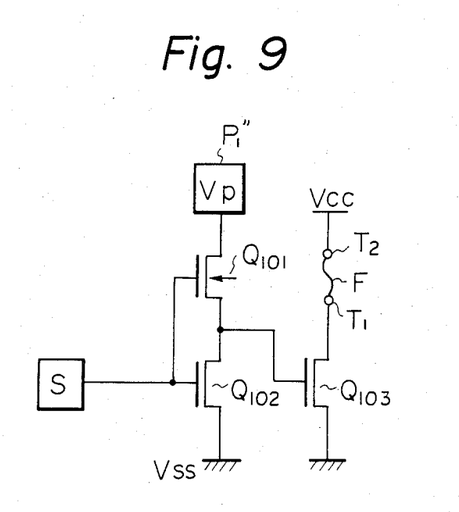
FIG. 9 is a second embodiment of a fusing circuit according to the present invention.
Figure 10:
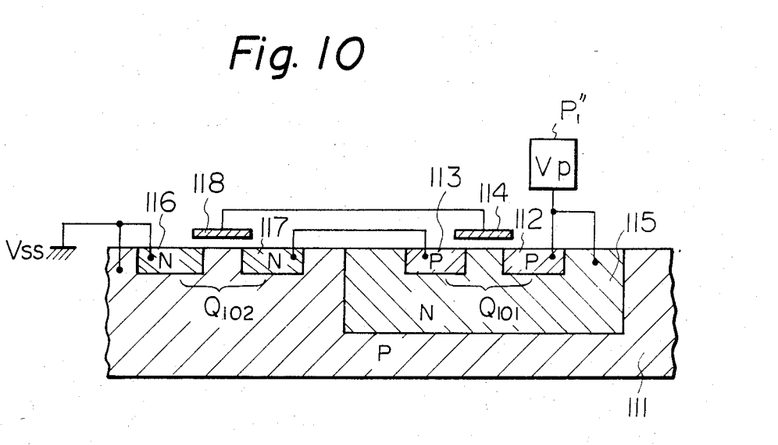
FIG. 10 is a cross-sectional view of the fusing circuit of FIG. 9.

FIG. 9 is another embodiment of the fusing circuit using a CMOS inverter, and FIG. 10 is a cross-sectional view of the construction of the circuit shown in FIG. 9. The difference between FIG. 9 and FIG. 5 is that an external terminal P''₁ connected to the drain of the P-channel transistor $Q_{101}$ receives a voltage $V_P$ which is greater than the source voltage $V_{cc}$. The circuit shown in FIG. 9 can be formed by using an N-type well CMOS inverter, as is shown in FIG. 10. In FIG. 10, a P-channel MOS transistor provided with a P-type drain region 112, a P-type source region 113, and a gate electrode 114 is formed in an N-type well 115 in the P-type semiconductor substrate 111. The P-type drain region 112 is connected to the external terminal P''₁. To prevent the current from flowing from the P-type drain region 112 to the N-type well 115, the P-type drain region 112 is connected to the N-type well 115 so that the P-type drain region 112 has the same voltage level as the N-type well 115. An N-channel MOS transistor $Q_{102}$ is formed by an N-type source region 116, an N-type drain region 117 formed on the semiconductor substrate 111, and a gate electrode 118. An N-channel transistor for blowing the fuse is not shown in the drawing because it is formed behind the transistors $Q_{102}$ and $Q_{101}$. The source region 116 of the transistor $Q_{102}$ is connected to the ground source $V_{cc}$. The gates electrode 114 of the transistor $Q_{101}$ and the gate electrode 118 of the transistor $Q_{102}$ are commonly connected, and the source region 113 of the transistor $Q_{101}$ is connected to the drain region 117 of the transistor $Q_{102}$.

In the P-type well shown in FIG. 10, the drain region 112 of the transistor $Q_{101}$ has the same electric potential as the N-type well 115. Therefore, if a voltage higher than $V_{cc}$ is supplied to the drain region 112, no current flows from the drain region 112 to the P-type well 115. When a high voltage is supplied to the drain of the transistor $Q_{101}$, the transistor $Q_{103}$ is definitely turned on, with the result that the fuse is definitely blown.

We claim:

1. A semiconductor memory device in which, when a defective cell exists among memory cells arranged in matrix form and a row or column containing the defective cell is selected, the row or column is switched to a predetermined redundant row or a predetermined redundant column additionally and independently provided so that the predetermined redundant row or the predetermined redundant column is selected, said device comprising:

a plurality of switching circuits;

a plurality of decoder circuits, respectively, operatively connected to said plurality of switching circuits, for selecting the row or column and providing a first output signal;

a plurality of fusing circuits, each of said fusing circuits included in one of said switching circuits, so that when a fuse of one of said plurality of fusing circuits is disconnected, the row or column containing the defective cell is switched to the redundant row or redundant column, each of said plurality of fusing circuits generating a second output signal and comprising:

a fuse;

a transistor, operatively connected between said fuse and the electric source, having a gate operatively connected to one of said decoder circuits, said transistor operating in response to the first output signal from said decoder circuits, each of said switching circuits comprising:

an inverter circuit, respectively, operatively connected to said fusing circuits, for inverting the second output signal of said fusing circuits and outputting a third output signal; and selector means, respectively, operatively connected to said fusing circuits and said inverter circuit, controlled by the second output signal from said fusing circuits and the third output signal from said inverter circuit, and having an input terminal, connected to one of said decoder circuits, for receiving the first output signal;

a first output terminal connected to one of the rows columns; and a second output terminal operatively connected to the predetermined redundant row or column, said selector means outputting the first output signal to one of said first and second output terminals in response to the second and third output signals.

2. A semiconductor memory device according to claim 1, wherein said decoder circuits are operatively connected to an electric source and, respectively, operatively connected to receive an address signal, and wherein each of said decoder circuits comprises:

a load transistor having one terminal operatively connected to the electric source; and a NAND circuit including a plurality of transistors, each of said plurality of transistors having a gate for receiving the address signal, and wherein a connecting point formed between said load transistor and said NAND circuit is operatively connected to said switching circuit.

3. A semiconductor memory device according to claim 1, wherein said selector means comprises:

a first field-effect-transistor having a control gate, respectively, operatively connected to receive the second output signal from said fusing circuits, a first terminal, respectively, operatively connected to receive the first output signal from said decoder circuits, and a second terminal operatively connected to the normal cell;

a second field-effect transistor having a control gate operatively connected to receive the third output signal from said inverter circuit, a first terminal operatively connected to receive the first output signal from said decoder circuit, and a second terminal operatively connected to the redundant cell;

a third field-effect transistor having a control gate, respectively, operatively connected to receive the second output signal from said fusing circuits, a first terminal operatively connected to said second terminal of said second transistor, and a second terminal operatively connected to the electric source; and a fourth field-effect transistor having a control gate operatively connected to receive the third output signal from said inverter circuit, a first terminal operatively connected to said second terminal from said first transistor, and a second terminal operatively connected to the electric source.

4. A semiconductor memory device having normal cells and redundant cells, comprising:

a decoder, operatively connected to the normal and redundant cells, for selecting the normal and redundant cells and providing first output signal;

a plurality of switching circuits, each of said switching circuits comprising:

a fusing circuit having a fuse, operatively connected to said decoder, for blowing the fuse upon receipt of the first input signal and outputting a signal, said fusing circuit including:

an input terminal;

an external terminal having a source voltage applied thereto;

a first transistor having a gate operatively connected to said input terminal, having a first terminal operatively connected to ground and having a second terminal;

a second transistor having a gate operatively connected to said gate of said first transistor, having a first terminal operatively connected to said second terminal of said first transistor and having a second terminal operatively connected to receive the source voltage;

a third transistor having a gate operatively connected between said first terminal of said second transistor and said second terminal of said first transistor, having a first terminal operatively connected to said external terminal, and having a second terminal; and said fuse having a first end operatively connected to said second terminal of said third transistor and having a second end operatively connected to receive the source voltage; and selector means, operatively connected to said fusing circuit, for supplying a first output signal, in response to the output signal from said fusing circuit, to a selected one of the normal cells and redundant cells.

5. A semiconductor memory device having normal cells and redundant cells, comprising:

a decoder, operatively connected to normal and redundant cells, for selecting the normal and redundant cells and providing a first output signal;

a plurality of switching circuits, each of said switching circuits including:

a fusing circuit having a fuse, operatively connected to said decoder, for blowing the fuse upon receipt of the first input signal and outputting a signal, said fusing circuit including:

an input terminal;

an external terminal having a first source voltage;

a first transistor having a gate operatively connected to said input terminal, having a first terminal operatively connected to ground and having a second terminal;

a second transistor having a gate operatively connected to said gate of said first transistor, having a first terminal operatively connected to said second terminal of said first transistor and having a second terminal operatively connected to said external terminal;

a third transistor having a gate operatively connected between said first terminal of said second transistor and said second terminal of said first transistor, having a first terminal operatively connected to ground and having a second terminal; and said fuse having a first end operatively connected to said second terminal of said third transistor and having a second end operatively connected to receive a second source voltage, the second source voltage having a voltage less than the voltage of the first source voltage; and selector means, operatively connected to said fusing circuit, for supplying a first output signal, in response to the output signal from said fusing circuit, to a selected one of the normal cells and redundant cells.

* * * * *

UNITED STATES PATENT AND TRADEMARK OFFICE
CERTIFICATE OF CORRECTION

PATENT NO. : 4,603,404

DATED : JULY 29, 1986

INVENTOR(S) : TAKAHIKO YAMAUCHI ET AL.

It is certified that error appears in the above-identified patent and that said Letters Patent is hereby corrected as shown below:

Col. 8, line 31, after "rows" insert --or--.

Col. 9, line 15, after "providing" insert --a--.

Signed and Sealed this

Fourth Day of November, 1986

[SEAL]

Attest:

DONALD J. QUIGG

Attesting Officer

Commissioner of Patents and Trademarks